US008656415B2

(12) United States Patent
Wihardja et al.
(10) Patent No.: US 8,656,415 B2
(45) Date of Patent: *Feb. 18, 2014

(54) METHOD AND SYSTEM FOR REMOVAL OF CLICKS AND NOISE IN A REDIRECTED AUDIO STREAM

(75) Inventors: James W. Wihardja, Fullerton, CA (US); Xiaoyan Vivian Qian, Irvine, CA (US); Jonathan Chien, Tustin, CA (US); Yair Kerner, Irvine, CA (US)

(73) Assignee: Conexant Systems, Inc., Irvine, CA (US)

( * ) Notice: Subject to any disclaimer, the term of this patent is extended or adjusted under 35 U.S.C. 154(b) by 1376 days.

This patent is subject to a terminal disclaimer.

(21) Appl. No.: 12/165,590

(22) Filed: Jun. 30, 2008

(65) Prior Publication Data

US 2009/0086987 A1 Apr. 2, 2009

Related U.S. Application Data

(63) Continuation-in-part of application No. 12/152,753, filed on May 16, 2008.

(60) Provisional application No. 60/997,404, filed on Oct. 2, 2007.

(51) Int. Cl.
*G06F 3/00* (2006.01)
*H03G 3/00* (2006.01)

(52) U.S. Cl.
USPC .......................................... 719/321; 381/108

(58) Field of Classification Search
USPC .......................................... 719/310; 381/108
See application file for complete search history.

(56) References Cited

U.S. PATENT DOCUMENTS

| | | | |
|---|---|---|---|
| 4,047,226 | A | 9/1977 | Hedges |
| 4,788,508 | A | 11/1988 | Kawai |
| 6,011,783 | A | 1/2000 | Interrante |
| 6,040,740 | A | 3/2000 | Dondale |
| 6,122,749 | A | 9/2000 | Gulick |
| 6,216,052 | B1 | 4/2001 | Gulick |
| 6,316,993 | B1 | 11/2001 | Hellums |
| 6,492,928 | B1 | 12/2002 | Rhode |
| 6,600,365 | B1 | 7/2003 | Frith |

(Continued)

OTHER PUBLICATIONS

Ninad Ghodke, On the Implications of Machine Virtualization for DRM and Fair Use: A case Study of a Virual Audio Device Driver, Oct. 25, 2004.*

(Continued)

*Primary Examiner* — Lechi Truong
(74) *Attorney, Agent, or Firm* — Farjami & Farjami LLP

(57) ABSTRACT

There is provided a method for use in a computer for redirecting an audio stream from a first audio endpoint to a second audio endpoint in the computer having a controller and a computer operating system for execution by the controller. The method includes directing the audio stream from a client application running on the computer operating system through a first audio resource stack of the computer to the first audio endpoint. The method further includes creating an audio endpoint bridge using the computer operating system, where the audio endpoint bridge provides a path for the audio stream to be directed from the first audio resource stack to pass through a second audio resource stack to the second audio endpoint. The method may also enhance the audio stream to reduce noise and redirect the audio stream to the second audio endpoint using the audio endpoint bridge.

11 Claims, 13 Drawing Sheets

(56) References Cited

U.S. PATENT DOCUMENTS

| | | | | |
|---|---|---|---|---|
| 6,772,024 | B2 | 8/2004 | Fujii | |
| 6,795,547 | B1 | 9/2004 | Bjarnason | |
| 6,810,273 | B1 | 10/2004 | Mattila | |
| 6,873,604 | B1 | 3/2005 | Surazski | |
| 7,065,206 | B2 * | 6/2006 | Pan | 379/406.03 |
| 7,079,450 | B2 | 7/2006 | Breed | |
| 7,164,312 | B1 | 1/2007 | Singh | |
| 7,289,626 | B2 * | 10/2007 | Carter et al. | 379/387.02 |
| 8,015,112 | B2 | 9/2011 | Prakken | |
| 2002/0021798 | A1 | 2/2002 | Terada | |
| 2002/0087863 | A1 * | 7/2002 | Seok et al. | 713/176 |
| 2003/0189906 | A1 | 10/2003 | Belcea | |
| 2004/0022237 | A1 | 2/2004 | Elliott | |
| 2004/0137846 | A1 | 7/2004 | Behboodian | |
| 2004/0139238 | A1 | 7/2004 | Luhrs | |
| 2004/0177167 | A1 | 9/2004 | Iwamura | |
| 2004/0258093 | A1 | 12/2004 | Powell | |
| 2005/0015805 | A1 * | 1/2005 | Iwamura | 725/79 |
| 2005/0138666 | A1 * | 6/2005 | Narusawa et al. | 725/89 |
| 2006/0282264 | A1 | 12/2006 | Denny | |
| 2007/0019828 | A1 | 1/2007 | Hughes | |
| 2007/0156812 | A1 * | 7/2007 | Hou et al. | 709/204 |
| 2008/0018395 | A1 | 1/2008 | Chi | |
| 2010/0048133 | A1 * | 2/2010 | Wang et al. | 455/41.3 |

OTHER PUBLICATIONS

Richard Davis, "Audio API Overview for Windows Vista Developers", Windows Vista Development Technical Articles, Oct. 2007, 4 pages, Microsoft Corporation, United States of America.

Microsoft Corporation, "sAPOs and the Windows Vista Audio Architecture (Windows Driver Kit)", Aug. 17, 2010, 2 pages, Microsoft Corporation, United States of America.

Microsoft Corporation, "Universal Audio Architecture", Draft Version 0.7b, Aug. 5, 2005, 8 pages, Microsoft Corporation, United States of America.

Richard Davis "Audio API Overview for Windows Vista Developers", Windows Vista Development Technical Articles, Oct. 2007, 4 Pages, Microsoft Corporation, United States of America.

Microsoft Corporation, "Exploring the Windows Vista Audio Engine (Window Driver Kit)", Aug. 17, 2010, 3 Pages, Microsoft Corporation, United States of America.

Microsoft Corporation, "GFX Filters (Window Driver Kit)", Aug. 17, 2010, 2 Pages, Microsoft Corporation, United States of America.

Microsoft Corporation, "Installing Custom sAPOs (Window Driver Kit)", Aug. 17, 2010, 3 Pages, Microsoft Corporation, United States of America.

Microsoft Corporation, "sAPOs and the Windows Vista Architecture (Window Driver Kit)", Aug. 17, 2010, 2 Pages, Microsoft Corporation, United States of America.

Microsoft Corporation, "Troubleshooting sAPO Load Failures (Window Driver Kit)", Aug. 17, 2010, 1 Page, Microsoft Corporation, United States of America.

Microsoft Corporation, "Wrapping or Replacing Windows Vista sAPOs (Window Driver Kit)", Aug. 17, 2010, 1 Page, Microsoft Corporation, United States of America.

Microsoft Corporation, "Custom Audio Effects in Windows Vista", May 10, 2006, 18 Pages, Microsoft Corporation, United States of America.

Microsoft Corporation, "Universal Audio Architecture", Draft Version 0.7b, Aug. 5, 2005.

8 Pages, Microsoft Corporation, United States of America.

* cited by examiner

METHOD AND SYSTEM FOR REMOVAL OF CLICKS AND NOISE IN A REDIRECTED AUDIO STREAM

CROSS-REFERENCE TO RELATED APPLICATIONS

This application is a continuation-in-part of U.S. patent application Ser. No. 12/152,753, filed on May 16, 2008, entitled "Method and System for Dynamic Audio Stream Redirection" which claims priority from U.S. Provisional Application No. 60/997,404, filed on Oct. 2, 2007, which is hereby incorporated by reference in its entirety.

BACKGROUND OF THE INVENTION

1. Field of the Invention

The present invention relates generally to computer audio systems. More particularly, the present invention relates to removal of clicks in computer audio systems.

2. Related Art

Microsoft Windows XP operating system (hereinafter referred to simply as "Windows XP") allows a hardware implementation of "dynamic stream redirect," wherein an audio stream is redirected from one audio output device to another audio output device. In a laptop computer running Windows XP, for example, an audio stream that is being outputted on an internal speaker in a laptop computer can be dynamically redirected to a headphone by a hardware switch when the headphone is plugged into the laptop computer. Alternatively, an audio stream that is being outputted to a headphone plugged into a headphone jack on a laptop computer running Windows XP can be dynamically redirected by a hardware switch to an internal speaker in the laptop computer when the headphone is unplugged. During dynamic stream redirect in Windows XP also causes the audio output device that was originally outputting the audio stream to be muted.

However, the operation of the audio architecture in Microsoft Windows Vista (hereinafter referred to simply as "Windows Vista") operating system has been changed compared to Windows XP such that dynamic stream redirect is not allowed in hardware. A Windows Hardware Logo Program requirement disallows switching between two audio outputs, where the switching occurs outside of the operating system's awareness. Also, Windows Hardware Quality Labs requires Windows Vista to support multistreaming, which allows a user to listen to two different audio sources on separate audio output devices. For example, multistreaming allows a user to listen to music on internal speakers in a laptop computer while conducting a Voice over Internet Protocol (VoIP) call on a headset that is plugged into the laptop computer. Thus, a user familiar with dynamic stream redirect in Windows XP cannot conventionally utilize this feature in Windows Vista.

FIG. 1 is a diagram illustrating audio system 100 for Windows XP. Audio system 100 includes client application 102, audio resource stack 104, which includes software resources 106 and hardware resources 108, hardware switch 110, speakers 112, and headphones 114. Software resources 106 include Windows audio engine 116 and audio processing object (APO) 118 and hardware resources 108 include direct memory access (DMA) engine 120 and digital-to-analog converter (DAC) 122. In audio system 100, client application 102, which can be, for example, Windows Media Player, generates an audio stream, which is provided to audio resource stack 104. The audio stream passes through Windows audio engine 116, which is a Microsoft component inside Windows XP operating system that determines the path of the audio stream, and through APO 118, which provides Digital Sound Processing (DSP) features, such as equalization, noise reduction, and echo cancellation, for the audio stream. Windows audio engine 116 directs the audio stream to DMA engine 120, which transfers the audio stream from memory to DAC 122 inside the audio codec. DAC 122 converts the audio stream from a digital format to an analog format for input to speakers 112 or headphones 114.

As shown in FIG. 1, hardware switch 110 receives the audio stream, which is in analog format, from DAC 122 and routes the audio stream to either speakers 112 or headphones 114 for playback. Thus, for Windows XP, the audio stream can be coupled to a hardware switch residing outside of the audio resource stack for routing to either speakers or headphones. However, this arrangement is not allowed for Windows Vista, since the operating system is not aware of the hardware switch and, therefore, cannot update the operating system's Graphical User Interface (GUI) regarding the outputted audio stream.

FIG. 2 is a diagram illustrating conventional audio system 200 for Windows Vista. Conventional audio system 200 includes client application 202, audio resource stacks 204 and 206, and audio endpoints 208 and 210. Audio resource stack 204 includes software resources 212, which includes Windows audio engine 214 and APO 216, and hardware resources 218, which includes DMA engine 220 and DAC 222. Audio resource stack 206 includes software resources 224, which include Windows audio engine 226 and APO 228, and hardware resources 230, which include DMA engine 232 and DAC 224. Windows audio engine 214, APO 216, DMA engine 220, and DAC 222 in audio resource stack 204 are substantially similar in function and operation to respective Windows audio engine 226, APO 228, DMA engine 232, and DAC 234 in audio resource stack 206.

In FIG. 2, client application 202, which can be, for example, Windows Media Player, provides an audio stream for audio endpoint 208, which provides audio output 236 (e.g., music). Audio endpoint 208 can be an audio output device, such as internal speakers in a laptop computer. For audio endpoint 208, an audio stream from client application 202 is passed to Windows audio engine 214, which is a Microsoft component inside Windows Vista for directing the audio stream to appropriate components in audio resource stack 204. Windows audio engine 214 sends the audio stream to APO 216, which functions similar to a plug-in to the Windows audio engine. In particular, APO 216 can provide DSP features, such as equalization, noise reduction, and echo cancellation, for the audio stream. After processing by APO 216, the audio stream is routed back to Windows audio engine 214, which directs the audio stream to DMA engine 220. DMA 220 transfers the audio stream from memory to DAC 222, which converts the audio stream from a digital format to an analog format for input to audio endpoint 208 (e.g., speakers).

In FIG. 2, audio resource stack 204 is independent of audio resource stack 206. In Windows Vista, there can be multiple copies or instances of software resources (e.g., Windows audio engines 214 and 216) that are independent of each other. Also, there can be multiple hardware resources (e.g., DMA engines 220 and 232) that are independent of each other. In Windows Vista, each audio endpoint is associated with a separate audio resource stack. For example, audio endpoint 208 is associated with audio resource stack 204. However, the audio resource stack and its associated audio endpoint are dormant until activated by instantiation of a client application on the audio resource stack that is connected to the audio endpoint. In other words, the audio resource stack and its associated audio endpoint can be activated by selecting an audio endpoint to link to a client application, such as Windows Media Player. When an audio resource stack is activated by a client application, an audio stream outputted by the client application can be routed through the audio resource stack for output by the audio endpoint that is connected to that stack.

Thus, in conventional audio system 200, client application 202 activates audio resource stack 204, thereby enabling an audio stream provided by client application 202 to be outputted by audio endpoint 208 (e.g., speakers) as audio output 236. However, since no client application, as indicated by dashed block 238, is selected and linked to audio resource stack 206, no audio stream is directed to audio endpoint 210 (e.g., headphones). Thus, in conventional audio system 200, without the present invention's audio endpoint bridge, a client application must be selected by the user for audio endpoint 210 to provide an audio stream to play over audio endpoint 210 (e.g., the headphones).

Accordingly, there is a strong need in the art to provide a method and system for achieving dynamic stream redirect in the Windows Vista operating system.

SUMMARY OF THE INVENTION

There are provided methods and systems for dynamically redirecting an audio stream from one audio endpoint to another audio endpoint and enhancing the audio stream in between to reduce noise, substantially as shown in and/or described in connection with at least one of the figures, as set forth more completely in the claims.

BRIEF DESCRIPTION OF THE DRAWINGS

The features and advantages of the present invention will become more readily apparent to those ordinarily skilled in the art after reviewing the following detailed description and accompanying drawings, wherein.

DETAILED DESCRIPTION OF THE INVENTION

Figure 1:
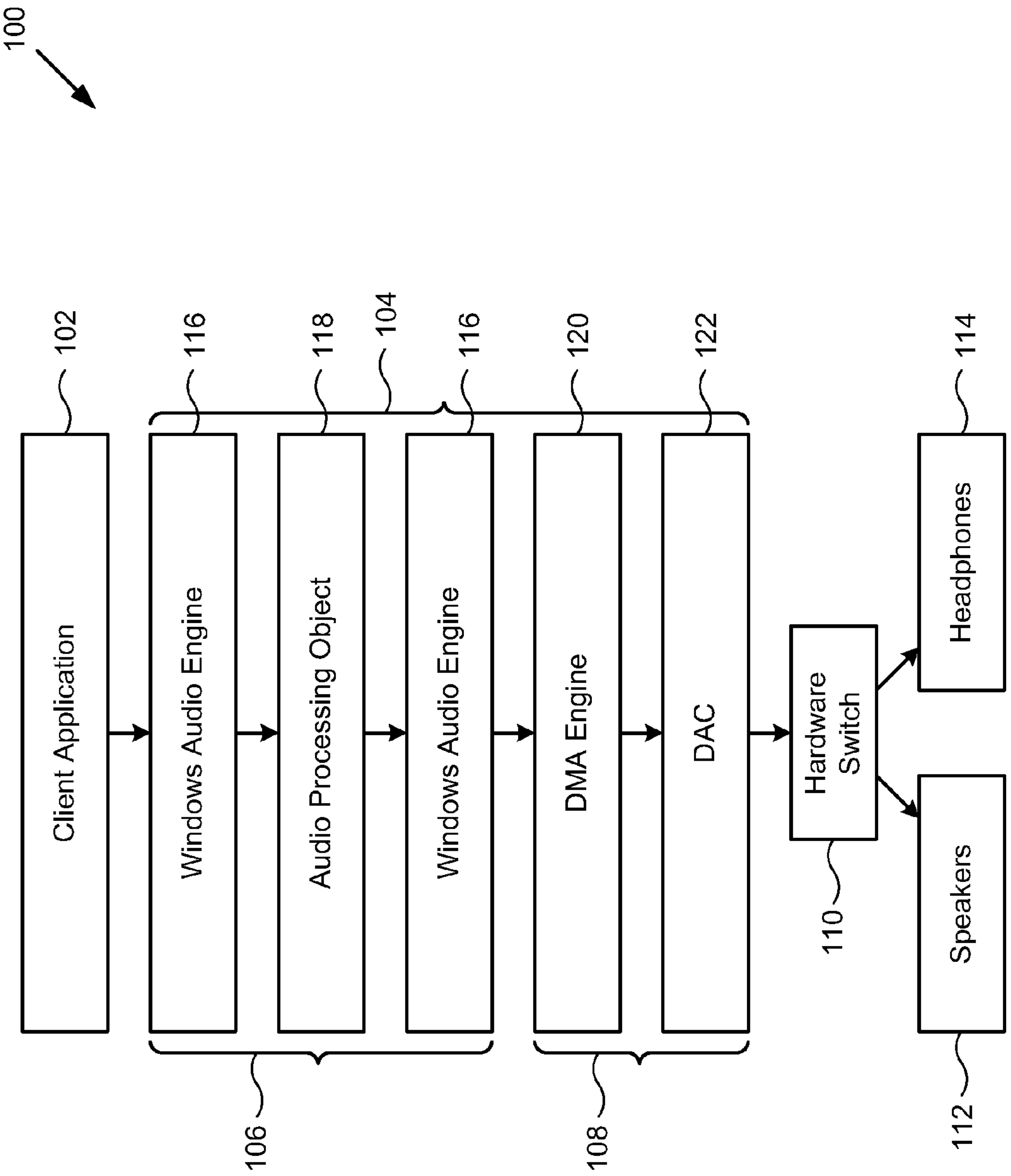
Fig. 1 (Prior Art)
FIG. 1 shows a diagram of a conventional audio system for Windows XP.
Figure 2:
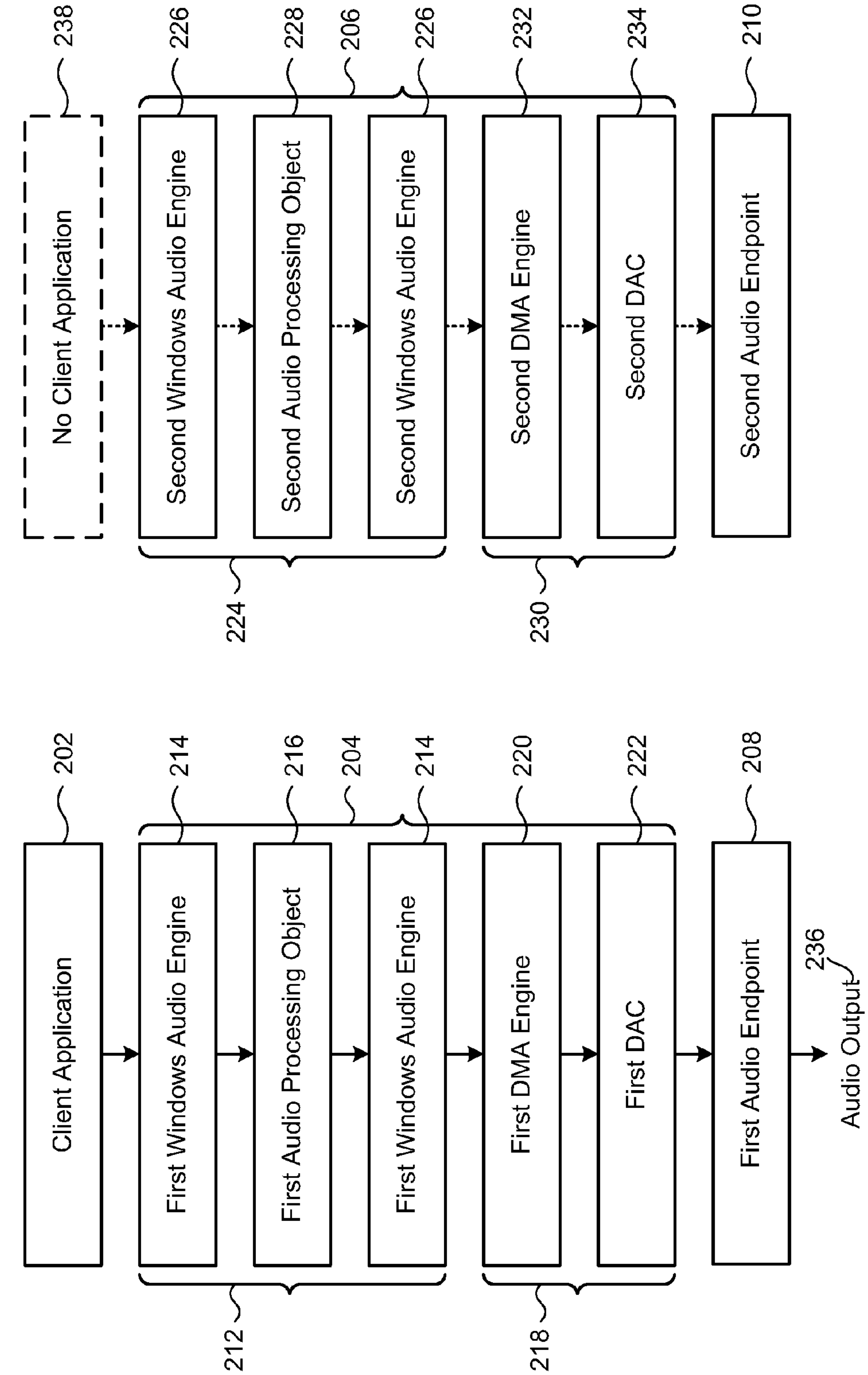
Fig. 2 (Prior Art)
FIG. 2 shows a diagram of a conventional audio system for Windows Vista.

The present application is directed to a method and system for dynamic stream redirection in Windows Vista. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art. The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals.

Figure 3:
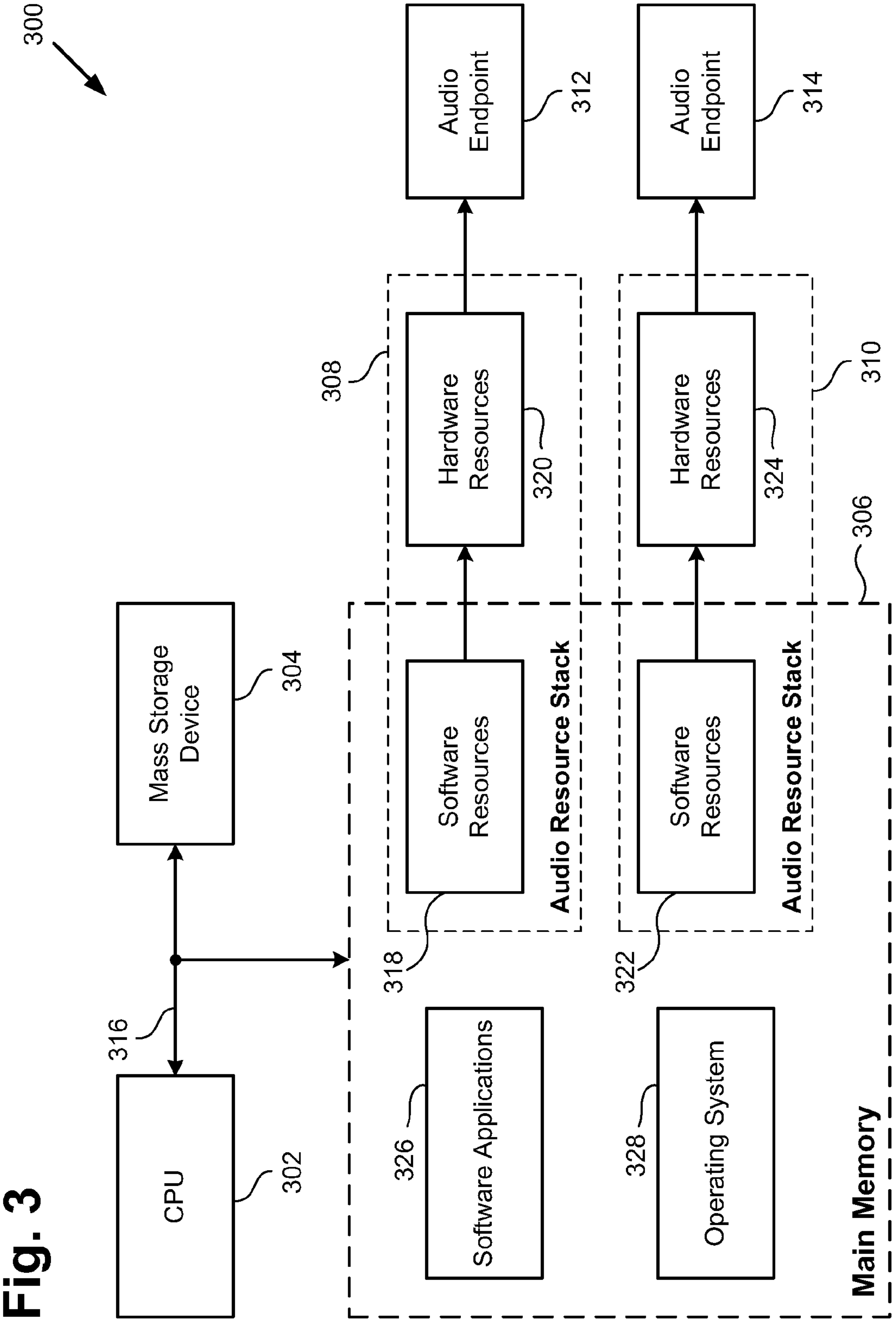
FIG. 3 shows a diagram of an exemplary system for implementing an audio endpoint bridge for redirecting an audio stream from one audio endpoint to another audio endpoint, according to one embodiment of the present invention.

FIG. 3 shows a diagram of system 300 for implementing an audio endpoint bridge between two audio endpoints, according to one embodiment of the present invention. In the embodiment of FIG. 3, system 300 includes a controller or central processing unit (CPU) 302, mass storage device 304, main memory 306, audio resource stacks 308 and 310, audio endpoints 312 and 314, and bus 316. System 300, which can be for example, a personal computer (PC) or a laptop computer, can also include input devices, a display, read only memory (ROM), an input/output (I/O) adapter, a user interface adapter, a communications adapter, and a display adapter, which are not shown in FIG. 3. System 300 can further include a compact disk (CD), a digital video disk (DVD), and a flash memory storage device, which are also not shown in FIG. 3, as well as other computer-readable media as known in the art. Audio resource stack 308 includes software resources 318 and hardware resources 320 and audio resource stack 310 includes software resources 322 and hardware resources 324.

As shown in FIG. 3, CPU 302 is coupled to mass storage device 304 and main memory 306 via bus 316, which provides a communications conduit for the above devices. CPU 302 can be a microprocessor, such as a microprocessor manufactured by Advanced Micro Devices, Inc., or Intel Corporation. Mass storage device 304 can provide storage for data and applications and can comprise a hard drive or other suitable non-volatile memory device. Main memory 306 provides temporary storage for data and applications and can comprise random access memory (RAM), such as dynamic RAM (DRAM), or other suitable type of volatile memory. Also shown in FIG. 3, main memory 306 includes software applications 326, which can include client applications such as Windows Media Player and a VoIP application, operating system 328, which can be Windows Vista, and software resources 318 and 322, which each include Windows audio engine and the invention's APO, which can provide a software audio endpoint bridge between audio endpoints 312 and 314.

It should be noted that software resources 318 and 322, software applications 326, and operating system 328 are shown to reside in main memory 306 to represent the fact that programs are typically loaded from slower mass storage, such as mass storage device 304, into faster main memory, such as DRAM, for execution. However, software resources 318 and 322, software applications 326, and operating system 328 can also reside in mass storage device 304 or other suitable computer-readable medium not shown in FIG. 3.

Further shown in FIG. 3, software resources 318 and 322 are coupled to the inputs of hardware resources 320 and 324 and the outputs of hardware resources 320 and 324 are coupled to audio endpoints 312 and 314, respectively. Hardware resources 320 and 324 can each include a DMA engine and a DAC. In the present embodiment, audio endpoints 312 and 314 can each be a speaker or pair of speakers, a headphone or pair of headphones, a Sony/Philips Digital Interconnect Format (SPDIF) device, or other audio output devices. For example, audio endpoint 312 can be internal speakers in a laptop computer and audio endpoint 314 can be headphones that are connected to a headphone jack on the laptop computer. It is noted that in the present application, a headphone jack can also be referred to an audio endpoint. In one embodiment, audio endpoint 312 or audio endpoint 314 can be USB speakers, which can be coupled to a USB port on, for example, a laptop computer.

Audio resource stack 308 or 310 can be activated by configuring CPU 302 to instantiate a client application, such as Windows Media Player, on the audio resource stack, thereby activating the respective audio endpoint that is connected to the activated stack. However, each audio endpoint is connected to an independent audio resource stack, which requires a separate client application to be instantiated on it for activation. In the present invention, an APO in a first audio resource stack that has been activated and coupled to a first audio endpoint, such as a pair of speakers, can be utilized to create an audio endpoint bridge to a second audio endpoint, such as headphones, by activating a second audio resource stack that is connected to the second audio endpoint. The APO can activate the second audio resource stack by creating a bridging application and linking the bridging application to the second audio resource stack, where the bridging application can emulate a client application, such as Windows Media Player, for the purpose of activating the stack. The audio endpoint bridge created by the invention's APO can be utilized to redirect an audio stream from the first audio endpoint to the second audio endpoint.

In one embodiment, the present invention provides an audio endpoint bridge, which is a software mechanism for routing an audio stream in a unique way around a Windows Vista audio resource stack to enable dynamic stream redirect (DSR) from one audio endpoint to another audio endpoint. In Windows Vista, an "audio endpoint" refers to a single device that can output or capture audio. For example, speakers, headphones, or a microphone can each be considered an audio endpoint. In order to meet multistreaming requirements, an audio codec designed for Windows Vista needs to include two DACs, which are each connected to a different audio endpoint. For example, a stack for a first audio endpoint, such as speakers, can include a first client application (e.g., Windows Media Player), a first DMA engine, a first APO, and a first DAC, and a stack for a second audio endpoint, such as headphones, can include a second client application (e.g., Skype), a second DMA, a second APO, and a second DAC. In the above example, the headphones and speakers each have their own instances of software resources and their own independent hardware resources. Because the software and hardware resources for each audio endpoint are independent, the Windows Vista audio resource stack has no capability for sending audio that is destined for a first audio endpoint to a second audio endpoint and vice versa.

The APO is a software point at which a vendor has access to an audio stream. The APO receives the audio stream that is destined for an audio endpoint, runs in user mode in Windows Vista, and can filter the samples (i.e., the audio stream) it receives. By utilizing these three properties of an APO, the present invention can utilize the APO to form an audio bridge across the endpoints (i.e., an audio endpoint bridge). Because the APO runs in user mode, the APO has full access to the system, like any other application. Although not its original purpose, the APO can create an audio endpoint bride by pulling in appropriate modules from the Software Developers Kit (SDK). The invention's audio endpoint bridge can intercept the audio stream destined for one audio endpoint, pretend to be a client application (instead of the driver that it is), and send the audio stream to any other audio endpoint. The invention's audio endpoint bridge can also utilize the APO filtering property to mute the original audio endpoint.

Figure 4:
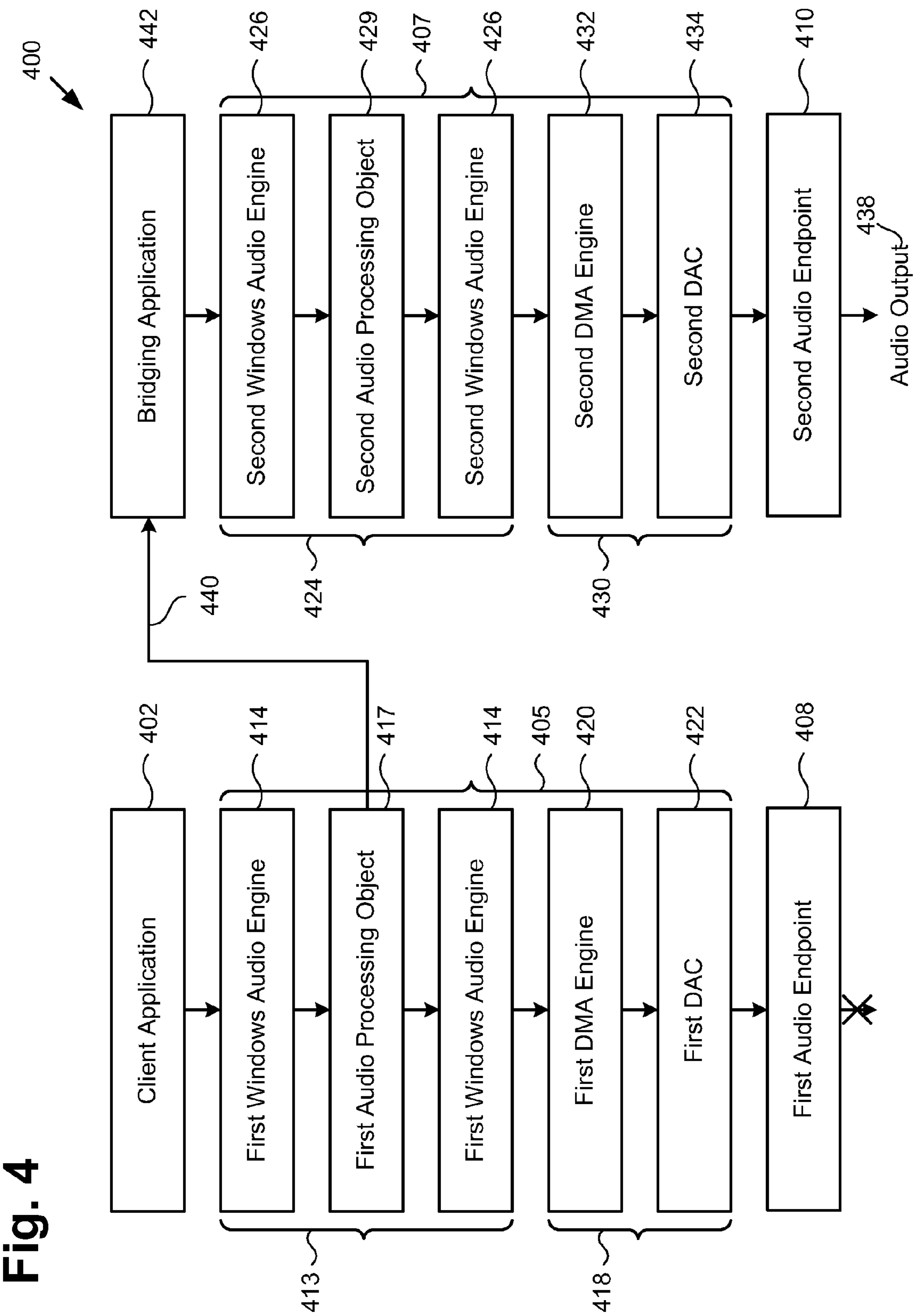
FIG. 4 shows a diagram of an exemplary audio system including an audio endpoint bridge in Windows Vista, according to one embodiment of the present invention.

FIG. 4 is a diagram illustrating audio system 400 including an audio endpoint bridge in Windows Vista, according to one embodiment of the present invention. In FIG. 4, client application 402, Windows audio engines 414 and 426, DMA engines 420 and 432, DACs 422 and 434, and audio endpoints 408 and 410 correspond, respectively, to client application 302, Windows audio engines 314 and 326, DMA engines 320 and 332, DACs 322 and 334, and audio endpoints 308 and 310 in FIG. 3. Audio system 400 includes client application 402, audio resource stack 405, which includes software resources 413 and hardware resources 418, audio resource stack 407, which includes software resources 424 and hardware resources 430, audio endpoints 408 and 410, audio endpoint bridge 440, and bridging application 442.

As shown in FIG. 4, client application 402, which can be Windows Media Player, is connected to audio endpoint 408, which can comprise speakers, by audio resource stack 405. Also shown in FIG. 4, audio resource stack 407 is connected to audio endpoint 410, which can comprise headphones. Further shown in FIG. 4, audio endpoint bridge 440 is connected between APO 417 and bridging application 442 and provides direct stream redirect in Windows Vista. Audio endpoint bridge 442 allows an audio stream from client application 402, which is selected for audio endpoint 408 (i.e., speakers) to be directed to audio endpoint 410 (i.e., headphones) via bridging application 442, which is created by APO 417. Bridging application 442 can hook into Windows audio engine 426 and emulate a client application so as to activate audio resource stack 407 and audio endpoint 410, thereby providing a path for the audio stream from client application 402 to audio endpoint 410.

Windows audio engine 414 can receive data (i.e., an audio stream) from Windows Media Player in, for example, a fixed point format and convert the data to a floating point format for APO 417. Windows audio engine 414 can convert the data from APO 417 from the floating point format back into a fixed point format for DMA engine 420 after the data has been processed by APO 417. Data is usually stored in a fixed point format and hardware is generally designed to utilize fixed point data. A client application can request to play floating point or fixed point formatted audio stream. In an embodiment of the invention, when a data stream is opened against another audio endpoint by the invention's APO, the bridging application created by the APO can specify if the audio stream is in a floating or fixed point format. APO 417 can also cause audio endpoint 408 to be muted, as indicated by the "x" placed over the arrow extending from audio endpoint 408, by zeroing the data (i.e., the audio stream) directed to audio endpoint 408. In one embodiment, APO 417 may not mute audio endpoint 408.

Bridging application 442 can receive the audio stream from client application 402 (e.g., Windows Media Player) and can feed the audio stream to audio endpoint 410 (i.e., headphones), which can provide audio output 438. Since bridging application 442 functions as a client application for audio endpoint 410, the Windows audio engine becomes aware of audio resource stack 407. Thus, for audio resource stack 407, bridging application 442 functions similar to another client application that is providing the audio stream. When audio endpoint 408 is muted, Windows audio engine 414 also becomes aware that the audio stream has been muted for audio endpoint 408. Thus, Windows audio engine 426 can correctly indicated to a user that audio endpoint 410 (i.e., headphones) are now active. Also, volume indicators and the like can be accurately updated by Windows Vista for audio endpoints 408 and 410. Further, since Windows Vista is aware of audio endpoint 410, and the invention's audio endpoint bridge meets the requirements of the Windows Hardware Logo Program.

Figure 5:
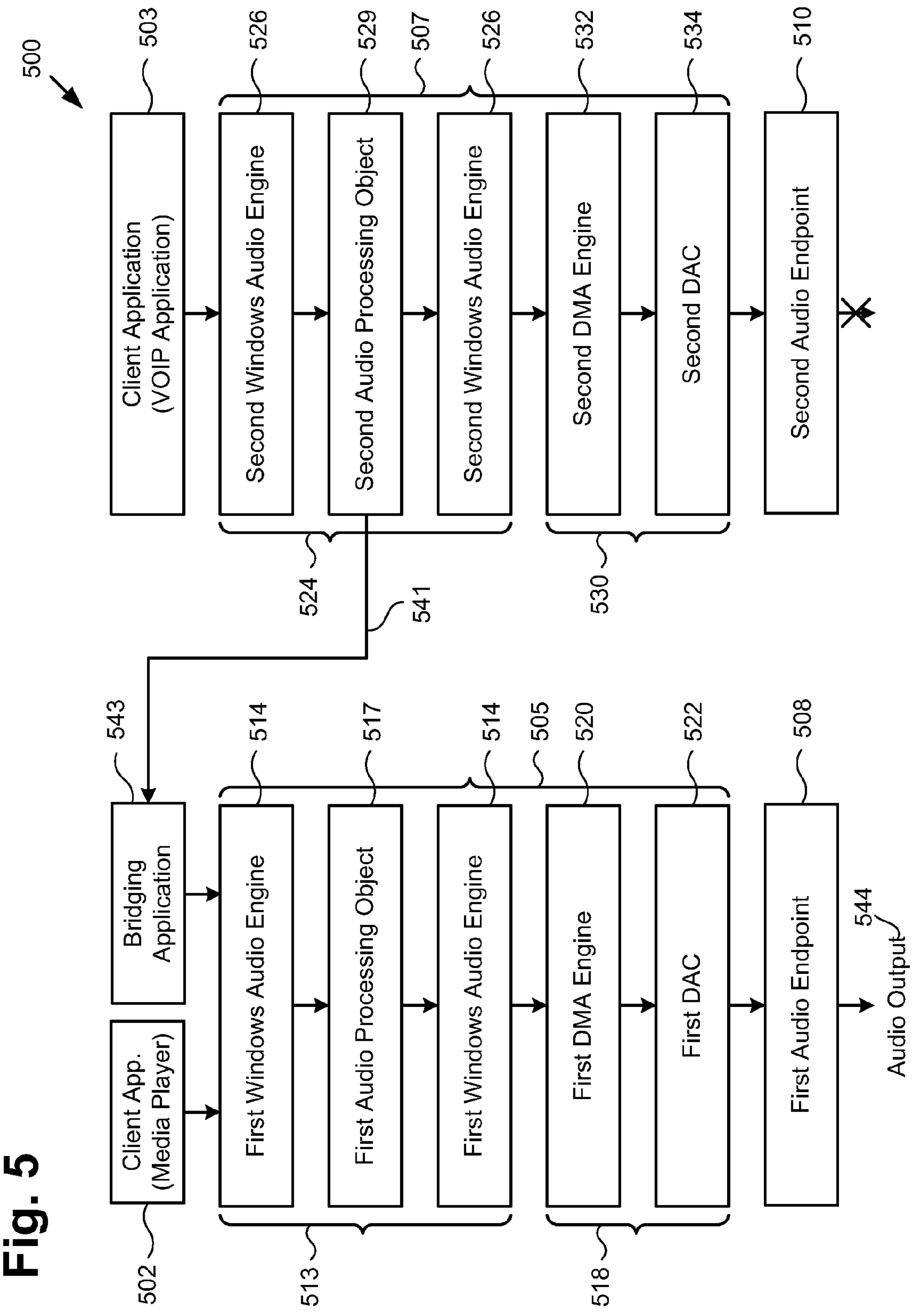
FIG. 5 shows a diagram of an exemplary audio system including an audio endpoint bridge in Windows Vista, according to another embodiment of the present invention.

FIG. 5 is a diagram illustrating audio system 500 including an audio endpoint bridge in Windows Vista, according to one embodiment of the present invention. In FIG. 5, client application 502, Windows audio engines 514 and 526, APOs 517 and 529, DMA engines 520 and 532, DACs 522 and 534, and audio endpoints 508 and 510 correspond, respectively, to client application 402, Windows audio engines 414 and 426, APOs 417 and 429, DMA engines 420 and 432, DACs 422 and 434, and audio endpoints 408 and 410 in audio system 400 in FIG. 4. Audio system 500 includes client applications 502 and 504, audio resource stack 505, which includes software resources 513 and hardware resources 518, audio resource stack 507, which includes software resources 524 and hardware resources 530, audio endpoints 508 and 510, audio endpoint bridge 543, and bridging application 543.

As shown in FIG. 5, client application 503, which can be a VoIP application, can be connected to audio endpoint 510, which can comprise headphones, via audio resource stack 507. When the embodiment of the invention in FIG. 5 detects that the headphones have been unplugged, which is indicated by the "x" placed over the arrow extending from audio endpoint 510, the audio stream from client application 503 (i.e., the VoIP application) is intercepted at APO 529, audio endpoint bridge 541 is provided to redirect the audio stream to audio endpoint 508 (i.e., the speakers). Audio endpoint bridge 541 can be provided by APO 529 by forming bridging application 543 and linking bridging application to audio resource stack 505, which is connected to audio endpoint 508. Bridging application 543 can be linked to audio resource stack 505 and audio endpoint 508 by instantiated it (i.e., bridging application 543) onto audio resource stack 505 by emulating a client application and hooking bridging application 543 into Windows audio engine 514.

Thus, in the embodiment in FIG. 5, client application 502, which can be Windows Media Player, and bridging application 543 are each sending an audio stream to Windows audio engine 514. As a result, Windows audio engine 514 can mix the respective audio streams from client application 502 and bridging application 543 to allow, for example, music from the Windows Media Player and a VoIP conversation from the VoIP application to be provided as audio output 544 by audio endpoint 508 (i.e., the speakers). One of the functions of the Windows audio engine is to manage two client applications when they are present at the same time, as in the example in FIG. 5. In audio system 500, a user can selectively mute either client application 502 (i.e., the Windows Media Player) or client application 503 (i.e., the VoIP application).

Figure 6:
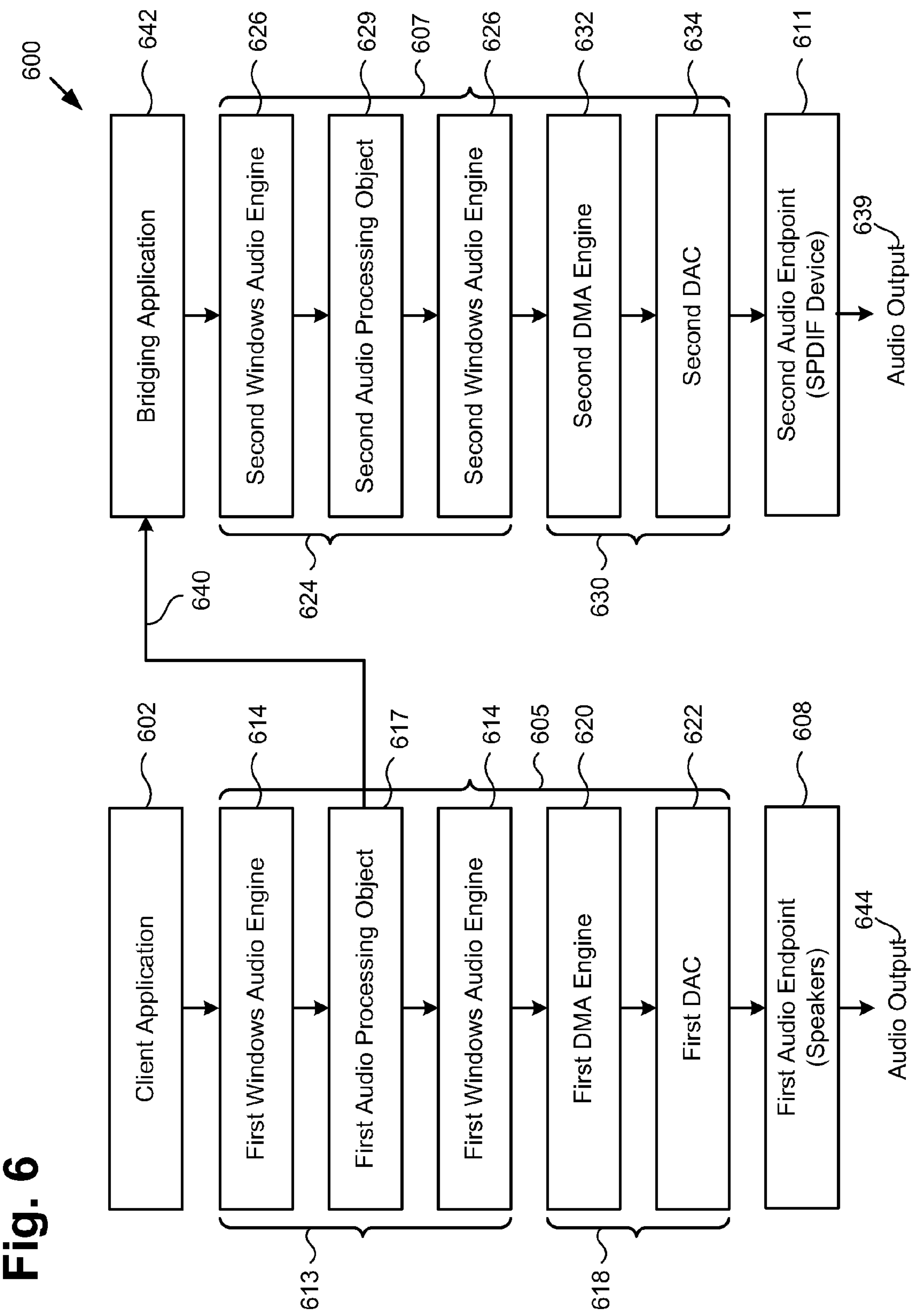
FIG. 6 shows a diagram of an exemplary audio system including an audio endpoint bridge in Windows Vista, according to another embodiment of the present invention.

FIG. 6 is a diagram illustrating audio system 600 including an audio endpoint bridge in Windows Vista, according to one embodiment of the present invention. In FIG. 6, client application 602, audio endpoint 608, Windows audio engines 614 and 626, APOs 617 and 629, DMA engines 620 and 632, DACs 622 and 634, audio endpoint bridge 640, and bridging application 642 correspond, respectively, to client application 402, audio endpoint 408, Windows audio engines 414 and 426, APOs 417 and 429, DMA engines 420 and 432, DACs 422 and 434, audio endpoint bridge 440, and bridging application 442 in audio system 400 in FIG. 4. Audio system 600 includes client application 602, audio resource stack 605, which includes software resources 613 and hardware resources 618, audio resource stack 607, which includes software resources 624 and hardware resources 630, audio endpoints 608 and 611, audio endpoint bridge 640, and bridging application 642. In audio system 600, an embodiment of the invention's audio endpoint bridge 640 is utilized for SPDIF cloning. With SPDIF cloning, a laptop or personal computer can be attached to a home theater amplifier via a single wire so as to allow audio from the laptop or personal computer to be heard through speakers connected to the amplifier.

As shown in FIG. 6, audio endpoint bridge 640 is formed between APO 617 and bridging application 642 to redirect an audio stream from audio endpoint 608, which can comprise speakers, to audio endpoint 611, which can comprise an SPDIF device. As a result, the audio stream provided by client application 602, which can comprise, for example, Windows Media Player, can be coupled through audio endpoint bridge 640, bridging application 642, and audio resource stack 607 to audio endpoint 611 (i.e., the SPDIF device) and provided as audio output 639. Audio endpoint bridge 640 can be provided by APO 617 by forming and linking bridging application 642 to audio resource stack 607, which is connected to audio endpoint 611 (i.e., an SPDIF device). Bridging application 642 can be linked to audio resource stack 607 and audio endpoint 611 by instantiated it (i.e., bridging application 642) on audio resource stack 607 by emulating a client application and hooking bridging application 642 into Windows audio engine 626.

Also shown in FIG. 6, audio endpoint 608 provides audio output 644. In one embodiment, audio endpoint 608 can be muted.

Figure 7:
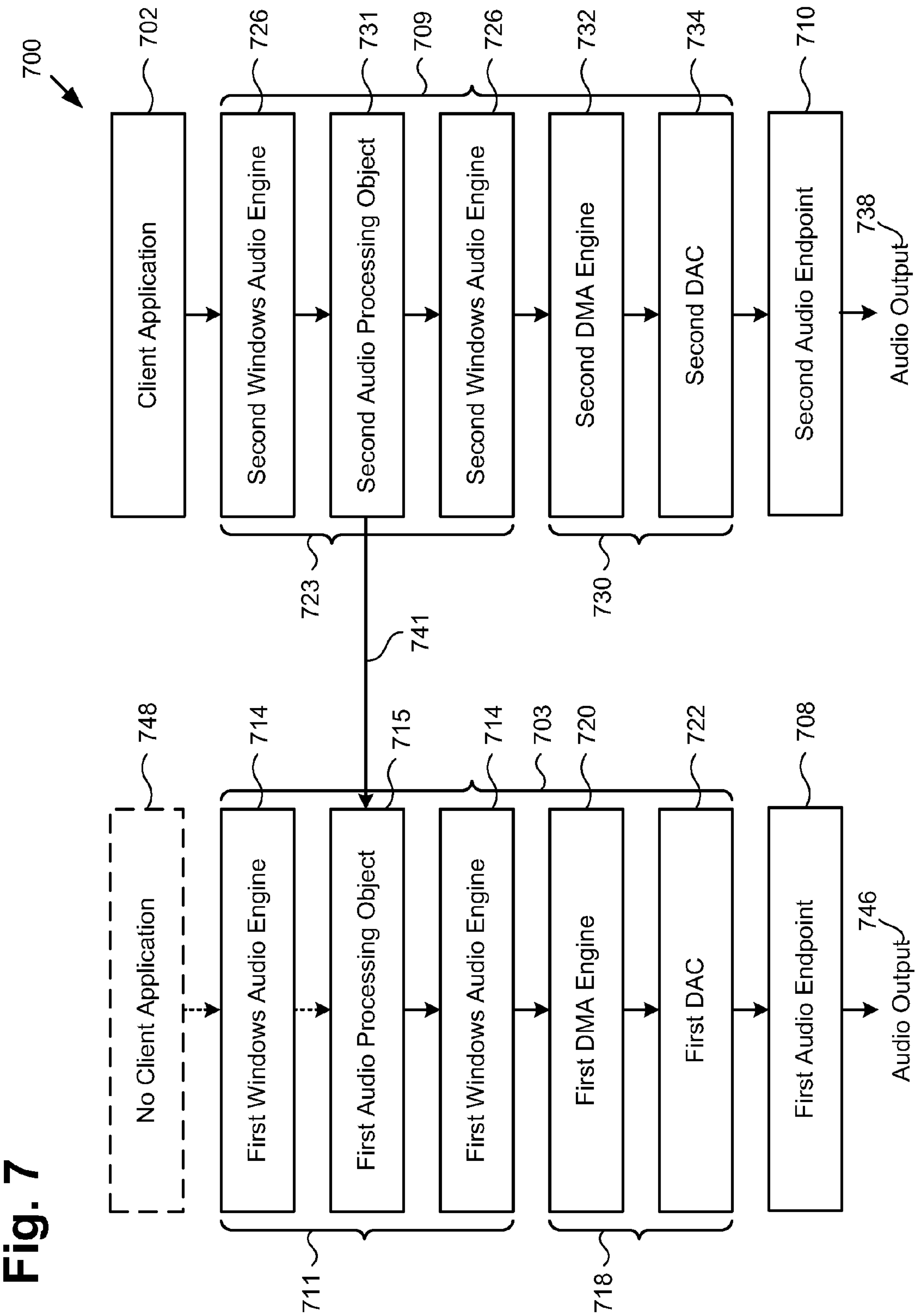
FIG. 7 shows a diagram of an exemplary audio system including an audio endpoint bridge in Windows Vista, according to another embodiment of the present invention.

FIG. 7 is a diagram illustrating audio system 700 including an audio endpoint bridge in Windows Vista, according to one embodiment of the present invention. In FIG. 7, audio endpoints 708 and 710, Windows audio engines 714 and 726, DMA engines 720 and 732, and DACs 722 and 734 correspond, respectively, to Windows audio engines 414 and 426, DMA engines 420 and 432, and DACs 422 and 434 in audio system 400 in FIG. 4. Audio system 700 includes client application 702, audio resource stack 703, which includes software resources 711 and hardware resources 718, audio resource stack 709, which includes software resources 723 and hardware resources 730, audio endpoints 708 and 710, and direct APO bridge 741. Software resources 711 include Windows audio engine 714 and APO 814, software resources 723, include Windows audio engine 726 and APO 731, hardware resources 718 include DMA engine 720 and DAC 722, and hardware resources 730 include DMA engine 732 and DAC 734.

Audio system 700 provides an alternative method for redirecting an audio stream from one endpoint to another endpoint in Windows Vista. In audio system 700, direct APO bridge 741 is formed between APO 731 in audio resource stack 709 and APO 715 in audio resource stack 703. As a result, an audio stream provided by client application 702, which can be Windows Media Player, is directed through direct APO bridge 741 to audio endpoint 708, which outputs the audio stream as audio output 746. In audio system 700, the audio stream from client application 702 is also outputted by audio endpoint 710 as audio output 738. For example, audio endpoint 708 can comprise speakers and audio endpoint 710 can comprise headphones. In audio system 700, no client application, as indicated by dashed box 748, is linked to audio resource stack 703. As a result, it is necessary to activate Windows audio engine 714 so that it (i.e., Windows audio engine 714) is aware that an audio stream is provided to audio endpoint 708.

Figure 8:
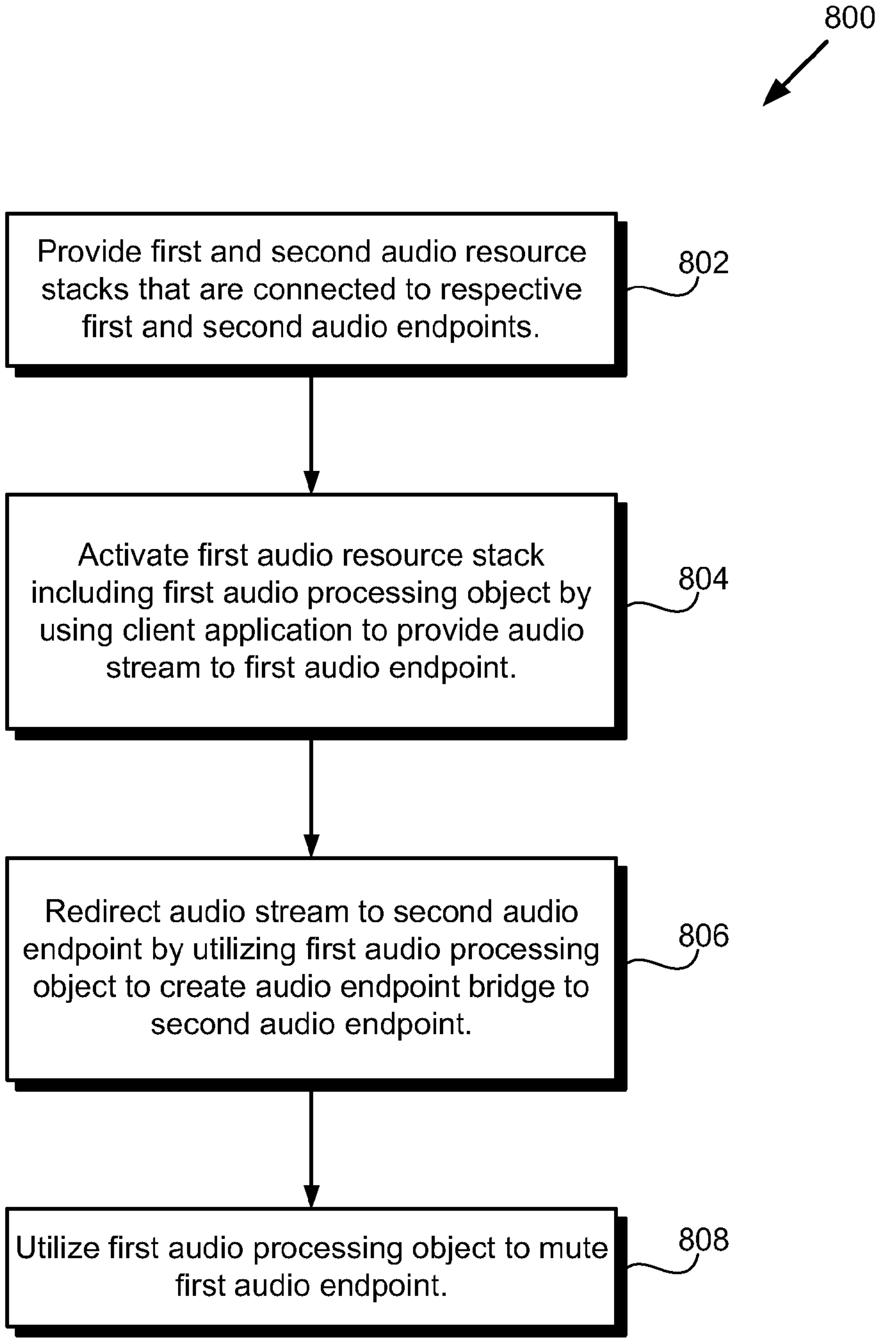
FIG. 8 is a flowchart presenting a method of dynamically redirecting an audio stream from one audio endpoint to another audio endpoint, according to one embodiment of the present invention.

FIG. 8 shows flowchart 800 depicting a method for redirecting an audio stream from one audio endpoint to another audio endpoint in a computer operating system, according to one embodiment of the present invention. Certain details and features have been left out of flowchart 800 of FIG. 8 that are apparent to a person of ordinary skill in the art. For example, a step may consist of one or more sub-steps or may involve specialized equipment, as known in the art. While steps 802 through 808 shown in flowchart 800 are sufficient to describe one embodiment of the present invention, other embodiments of the invention may utilize steps different from those shown in flowchart 800.

Beginning at step 802, first and second audio resource stacks (e.g., audio resource stacks 405 and 407 in FIG. 4) are provided, where the first and second audio resource stacks are connected to respective first and second audio endpoints (e.g., respective audio endpoints 408 and 410 in FIG. 4). For example, the first audio endpoint can comprise speakers and the second audio endpoint can comprise headphones. The first and second audio resource stacks include components (e.g., respective Windows audio engines 414 and 426 in FIG. 4) that reside in a computer operating system, such as Windows Vista. At step 804, the first audio resource stack (e.g., audio resource stack 405) including a first APO (e.g., APO 417 in FIG. 4) is activate by a client application (e.g., client application 402) so as to provide an audio stream to the first audio endpoint (e.g., audio endpoint 408). The client application can activate the first audio resource stack by being instantiated onto it (i.e., the first audio resource stack), thereby also activating the first audio endpoint. For example, the client application can be Windows Media Player.

At step 806, the audio stream from the client application (e.g., client application 402) is redirected to the second audio endpoint (e.g., audio endpoint 410) by utilizing the first APO (e.g., APO 417) to create an audio endpoint bridge (e.g., audio endpoint bridge 440 in FIG. 4) to the second audio endpoint. The first APO can create the audio endpoint bridge by forming a bridging application (e.g., bridging application), which emulates a client application, and linking the bridging application to the second audio resource stack (e.g., audio resource stack 407). At step 808, the first APO (e.g., APO 417) is utilized to mute the first audio endpoint (e.g., audio endpoint 408). In one embodiment, the first APO may not mute the first audio endpoint such that the audio stream from the client application is provided at both first and second audio endpoints.

Figure 9:
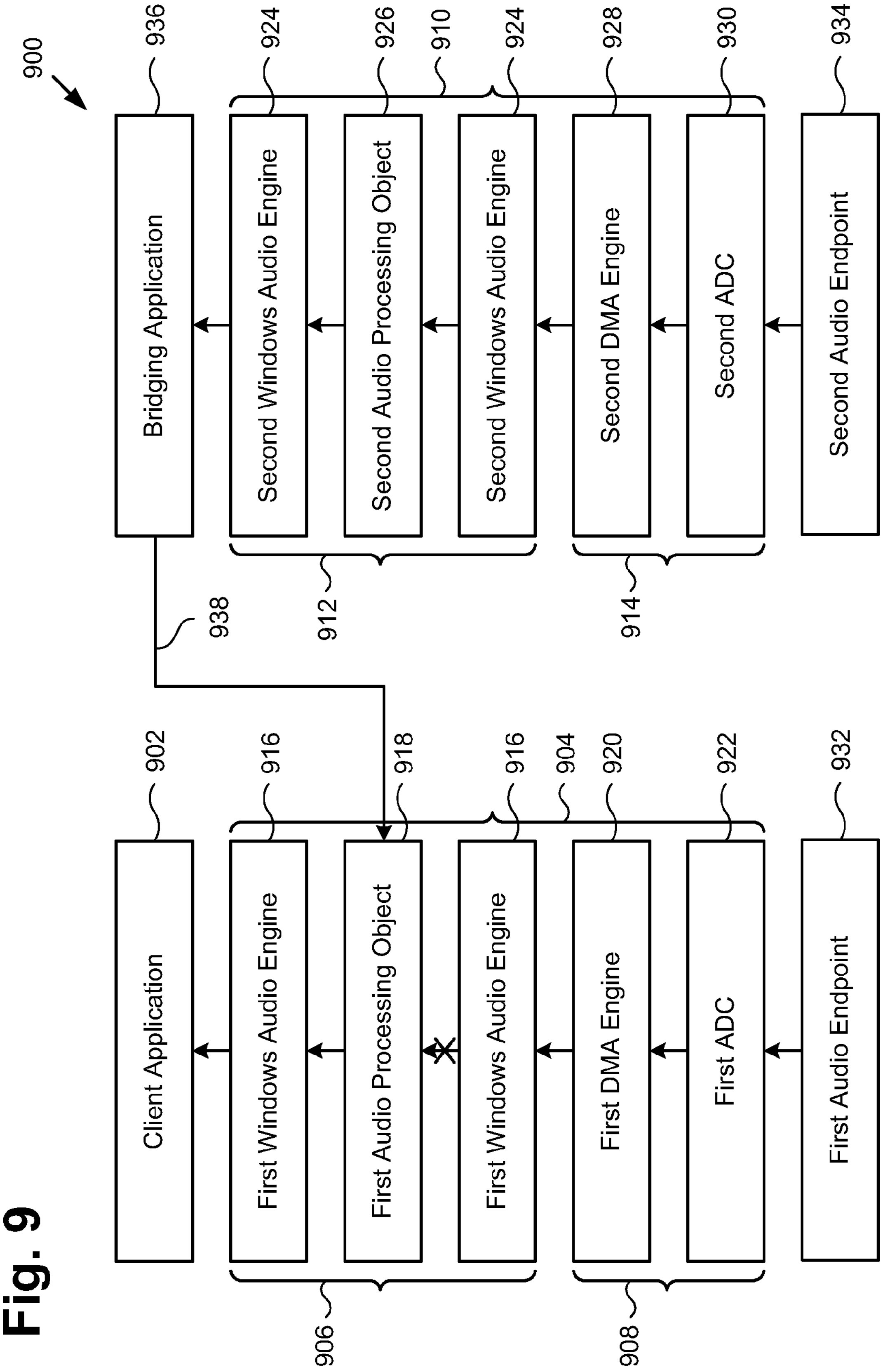
FIG. 9 shows a diagram of an exemplary audio system including an audio endpoint bridge in Windows Vista, according to another embodiment of the present invention.

FIG. 9 is a diagram illustrating audio system 900 including an audio endpoint bridge in Windows Vista, according to one embodiment of the present invention. Audio system 900 includes client application 902, audio resource stack 904, which includes software resources 906 and hardware resources 908, audio resource stack 910, which includes software resources 912 and hardware resources 914, audio endpoints 932 and 934, bridging application 936, and audio endpoint bridge 938. Software resources 906 include Windows audio engine 916 and APO 918, software resources 912 include Windows audio engine 924 and APO 926, hardware resources 908 include DMA engine 920 and analog-to-digital converter (ADC) 922, and hardware resources 914 include DMA engine 928 and ADC 930.

In audio system 900, client application 902, which can be an audio recording application, is linked to audio endpoint 932 by audio resource stack 904. Audio endpoint 932 can be, for example, a microphone on a personal computer or a laptop computer. As a result, an audio stream generated by audio endpoint 932 can be directed through audio resource stack 904 to client application 902. Audio endpoint 934 can be, for example, a Bluetooth headset and is connected to audio resource stack 910. In audio system 900, APO 918 can form bridging application 938, which can be linked to audio resource stack 924 through hooks in Windows audio engine 924. As a result, audio endpoint bridge 938 can be formed between bridging application 936 and APO 918, thereby providing a path to APO 918 for the audio stream generated by audio endpoint 934. Bridging application 936 can activate audio resource stack 407 and audio endpoint 410 by emulating a function of a client application.

Once audio endpoint bridge 938 has been formed, APO 918 can replace the audio stream from audio endpoint 932 with the audio stream from audio endpoint 934 and direct it (i.e., the audio stream from audio endpoint 934) to client application 902. Thus, client application 902 can record the audio stream from audio endpoint 934 instead of the audio stream from audio endpoint 932. APO 918 can be configured to form audio endpoint bridge 938 in response to, for example, a signal from the Bluetooth headset linked to audio resource stack 910. In one embodiment, audio streams from respective audio endpoints 932 and 934 can be received by APO 918, mixed in Windows audio engine 916, and recorded as a mixed audio stream by client application 902.

In an embodiment of the invention, a Bluetooth headset can be linked to a laptop computer to enable a VoIP conversation to be redirected to the Bluetooth headset by turning on the headset. By utilizing the invention's audio endpoint bridge, the redirection can occur immediately without having to hang up the VoIP call. If Skype is being used for a VoIP application, both the output and the recording can be redirected because both the microphone and speakers can be used concurrently.

In an embodiment of the invention, a USB speaker can provide an audio endpoint to target. Windows Vista can create an audio resource stack for the USB speaker. The invention's APO can look for that audio endpoint and form a bridging application on the audio resource stack for the USB speaker. For example, when a user plugs in the USB speaker it can immediately become active and begin playing an audio stream that the user was listening to on another audio endpoint. The present invention's audio endpoint bridge can be generally utilized to redirect an audio stream to any audio capable device.

By utilizing an audio endpoint bridge to provide DSR as discussed above, various embodiments of the present invention advantageously may avoid the expense of any additional hardware mixers, which are not allowed by the Windows Hardware Logo Program. Because standard operating system APIs are utilized, Windows Vista is fully aware of the audio stream that is going into each audio endpoint. Also, because Windows Vista is aware of the audio stream, the Windows Vista volume meters and other user interface improvements function as they should on the associated audio endpoints. Various embodiments of the present invention also advantageously provide a capability for Windows Vista that a user is familiar with in Windows XP but is no longer conventionally possible in Windows Vista when multistreaming is present.

In addition to redirection of the audio stream between the first audio stack and the second audio stack, the bridging application can be used to enhance the audio signal. Using the example of system 900 in FIG. 9, a noisy Bluetooth headset is attached to second audio endpoint 934 and redirected ultimately to a VoIP application as client application 902. Conventionally, if the Bluetooth headset is noisy by nature or by environment, the audio stream produced can only be enhanced outside the audio stack, that is by some hardware interfacing with the Bluetooth headset or by the client application. The former could be expensive and the latter is unlikely except for a client application specially tailored to the Bluetooth headset. Fortunately, with the various embodiments described above including that of system 900, the bridging application enables a third party entry point for enhancing an audio stream.

Similarly, there may be circumstances where noise enters the audio stream through the client application. Suppression of this noise can be accomplished by a bridging application such as bridging application 442 or bridging application 543 in system 400 and system 500, respectively. This suppression can be desirable in VoIP applications, for example, if noise is introduced through hardware or environment by the remote party. The bridging application provides a third party entry point for enhancing the audio stream in the inbound direction as well.

Many known types of noise suppression or reduction can be applied such as smoothing filters for the removals of pops and clicks, noise spectrum frequency suppressors for suppression noise of known spectral characteristics and noise cancellation, such as linear predictive noise cancellation, all of which are well known to those of ordinary skill in the art. The bridging application can capture the audio stream from the first audio stack and process the stream using a noise suppression or reduction technique and then introducing the enhanced audio stream into the second audio stack. In some dual-ended techniques the bridging application captures both the inbound and outbound audio streams from the first audio stack and uses both audio streams to provide noise suppression or reduction to one or both audio streams before introducing them back into the second audio stack.

A specific technique for noise reduction in VoIP application has previously been presented in commonly owned U.S. patent application Ser. No. 11/438,011, entitled "Inbound Noise Reduction for VoIP Applications" filed on May 19, 2006 and is incorporated by reference.

Figure 10:
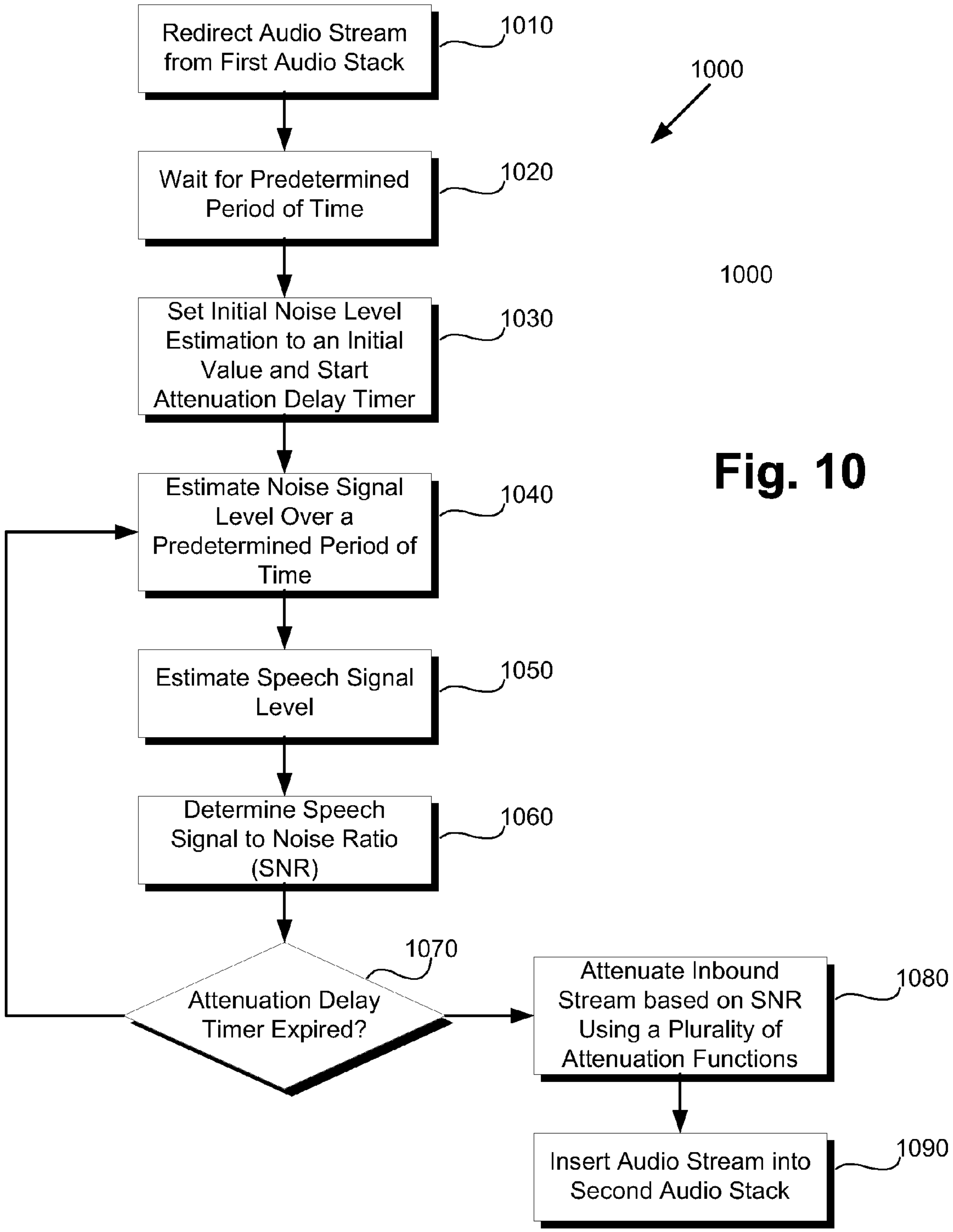
FIG. 10 illustrates an inbound noise reduction method for use by the bridge application in a VoIP application.

The general noise reduction technique as incorporated into the system 400 or 500 is summarized in FIG. 10. For the sake of simplicity, system 400 is used as a reference, but the method could easily apply to system 500 or other systems apparent to those of ordinary skill. At step 1010, the noise reduction system begins by bridging application 440 capturing the inbound signal from first audio stack 405. Next at step 1020, noise reduction method 1000 begins by waiting for a predetermined period of time before commencing, such as one second. At this time bridging application 440 could send the captured audio signal to second audio stack 407. The insertion of this initial delay is quite advantageous because the initial delay prevents the noise estimation algorithm from converging upon non-speech signals. For example, at the beginning of a call, there may be ring and ring back signals that are included in the inbound stream, and the initial delay prevents consideration of such signals for the signal-to-noise ratio (SNR) estimation. More specifically, this delay can be implemented by using a timer.

Further, at step 1030, noise reduction method 1000 starts an attenuation delay timer to ensure that noise level estimation occurs for a predetermined time before attenuating the inbound stream. For example, the attenuation delay timer may be set for one second to ensure that noise estimation algorithm has run for a significant period of time, such that the noise level estimation has resulted in a reliable value. Next, noise reduction method 1000 moves to step 1040, where noise reduction method 1000 uses a noise level estimator to estimate a noise level for various components of the inbound stream (e.g., a number of frequency bands, such as 65 frequency bands for 0-8 kHz) over a predetermined period of time. For example, in one embodiment, the predetermined period of time is about two seconds. Because the rate of noise level estimation is slower for the inbound stream, sudden changes in the noise level, such as problems caused by a comfort noise generator (CNG) and automatic gain control (AGC), will have less effect on the reliability of the noise level estimation for the inbound stream. In one embodiment (not shown in FIG. 5), at step 1040, noise reduction method 1000 detects silence areas of the speech signal, and when a silence area is detected, noise reduction method 1000 stops the noise level estimation until the end of the silence area is detected. As a result, the noise level estimations are not determined when comfort noise is being generated.

At step 1050, noise reduction method 1000 uses a speech signal level estimator to estimate a speech signal level for various components of the inbound stream (e.g., a number of frequency bands, such as 65 frequency bands for 0-8 kHz). Next, at step 1060, noise reduction method 1000 estimates the SNR for the inbound stream. Next, at step 1070, prior to attenuating the inbound stream, noise reduction method 1000 determines whether the attenuation delay timer has expired. If the attenuation delay timer has not expired, inbound noise reduction method moves back to step 1030, where noise reduction method 1000 continues to estimate the noise level for the inbound signal. However, if the attenuation delay timer has expired, noise reduction method 1000 moves to step 1080, where inbound noise reduction method attenuates the inbound stream using a plurality of attenuation functions. At step 1090 the attenuated signal is then reintroduced to second audio stack 407 by bridging application 442.

Figure 11:
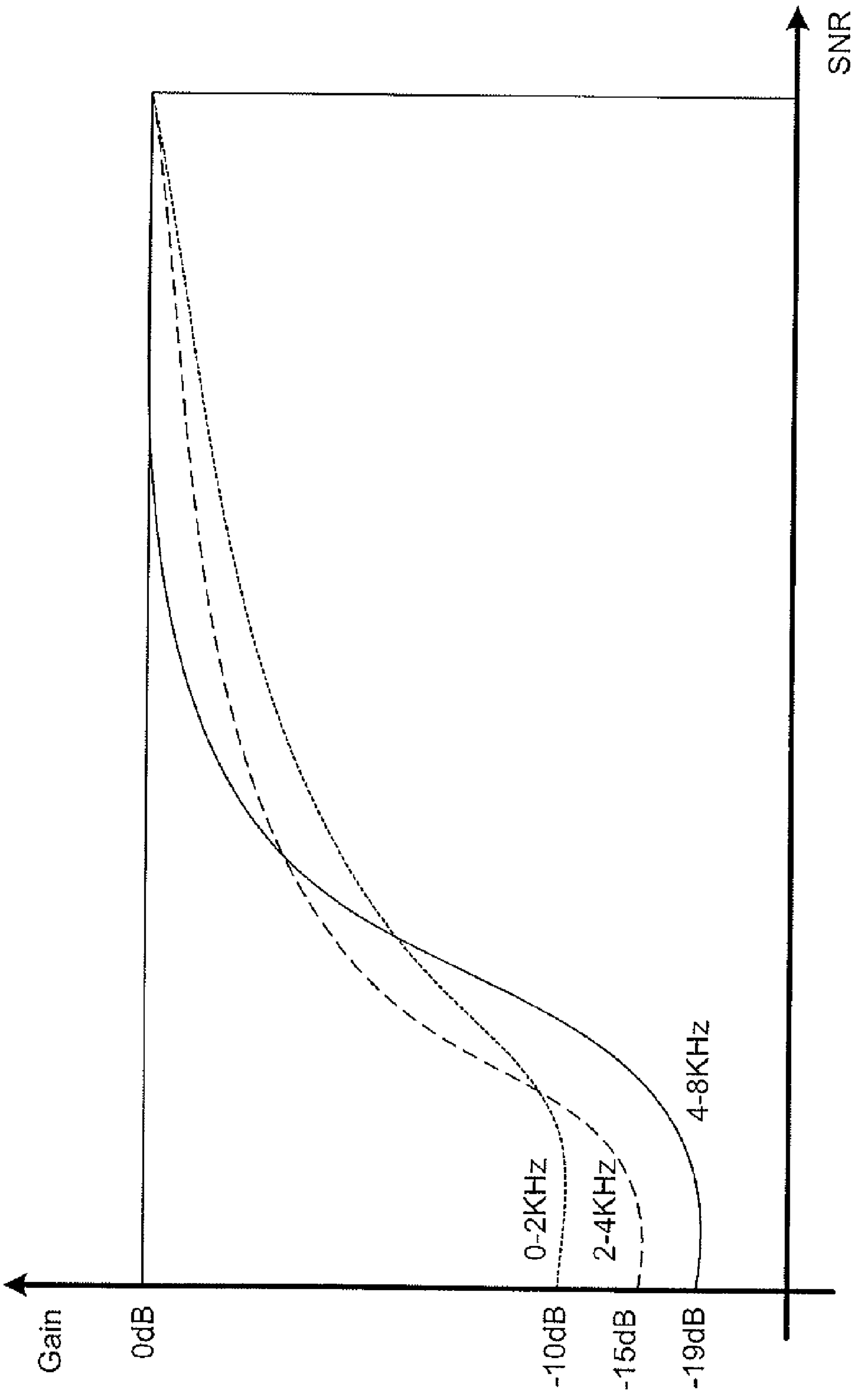
FIG. 11 illustrates graphs of a plurality of inbound attenuation functions for the frequency ranges of 0-2 kHz, 2-4 kHz and 4-8 kHz that can be used by the inbound noise reduction method of FIG. 10.

With reference to FIG. 11, in one embodiment of the present invention, three different attenuation functions of attenuators are used for three frequency ranges. In other embodiments, however, two or more different attenuation functions could be used, and the frequency ranges could be different than those shown in FIG. 11. As shown, the short-dashed graph illustrates a first attenuation function used for the frequency range of 0-2 kHz that determines maximum attenuation to be applied to the inbound stream as a function of the SNR determined in step 1060. Further, the long-dashed graph illustrates a second attenuation function used for the frequency range of 2-4 kHz that determines maximum attenuation to be applied to the inbound stream as a function of the SNR determined in step 1060. Also, the solid graph illustrates a third attenuation function used for the frequency range of 4-8 kHz that determines maximum attenuation to be applied to the inbound stream as a function of the SNR determined in step 1060. For example, because of the existence of the most speech content in the frequency range of 0-2 kHz, the first attenuation function is the most conservative and applies less maximum attenuation for higher SNRs (e.g., −10 dB) than the second attenuation function (e.g., −15 dB), but applies a higher maximum attenuation for lower SNRs than the second attenuation function. Also, because of the existence of more speech content in the frequency range of 2-4 kHz than in the frequency range of 4-8 kHz, the second attenuation function is more conservative than the third attenuation function and applies less maximum attenuation for higher SNRs (e.g., −15 dB) than the third attenuation function (e.g., −19 dB), but applies a higher maximum attenuation for lower SNRs than the third attenuation function, which is used for 4-8 kHz with less amount of speech content. Furthermore, in one embodiment, noise reduction method 1000 detects silence areas of the speech signal; and when a silence area is detected, noise reduction method 1000 applies the same maximum attenuation for all frequency bands in the silence area, rather than a different maximum attenuation based on SNR of each frequency band.

Figure 12:
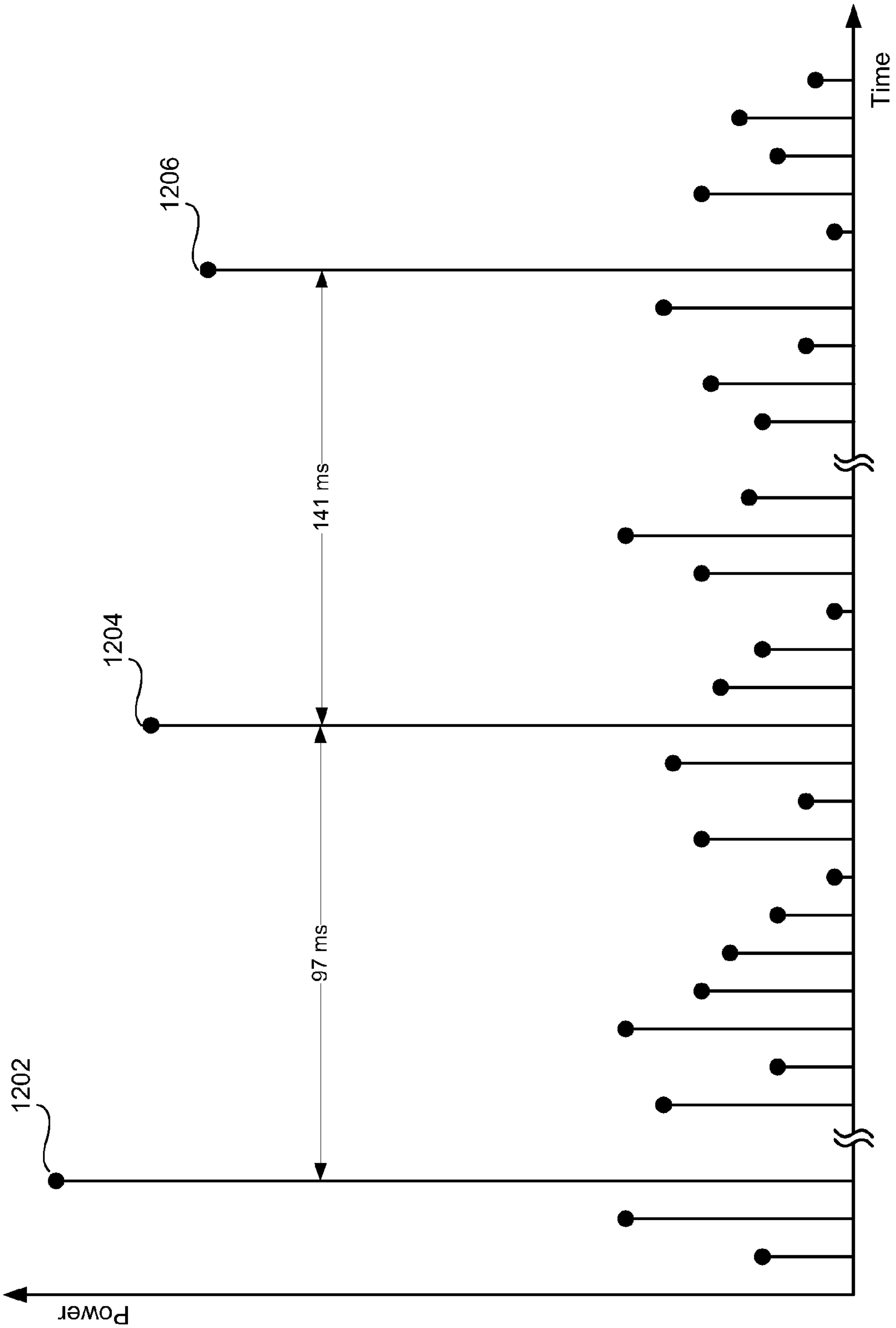
FIG. 12 illustrates a typical example of "spikey" noise.

Returning to the example of system 900, it has been observed that in the configuration described above, certain Bluetooth headsets exhibit "spikey" noise of unknown origin. In the digital time domain, this is characterized by single or small numbers of high energy spikes which occur infrequently, such as roughly 100 ms apart. These spikes, however, are not necessarily periodic and cannot easily be predicted. FIG. 12 illustrates a typical example where spikes are seen at sample 1202, 1204, and 1206. The interval between spikes shown in the example is 97 ms between spikes 1202 and 1204 and 141 ms between spikes 1204 and 1206. In observation, the noise is apparently introduced by either the headset or its interface and is heard to annoying effect by the listening party. While it is not uncommon to use techniques such as a median filter to remove spikes, median filters have the effect of a low pass filter which may be undesirable over the entire audio signal when spikes are sporadic.

Figure 13:
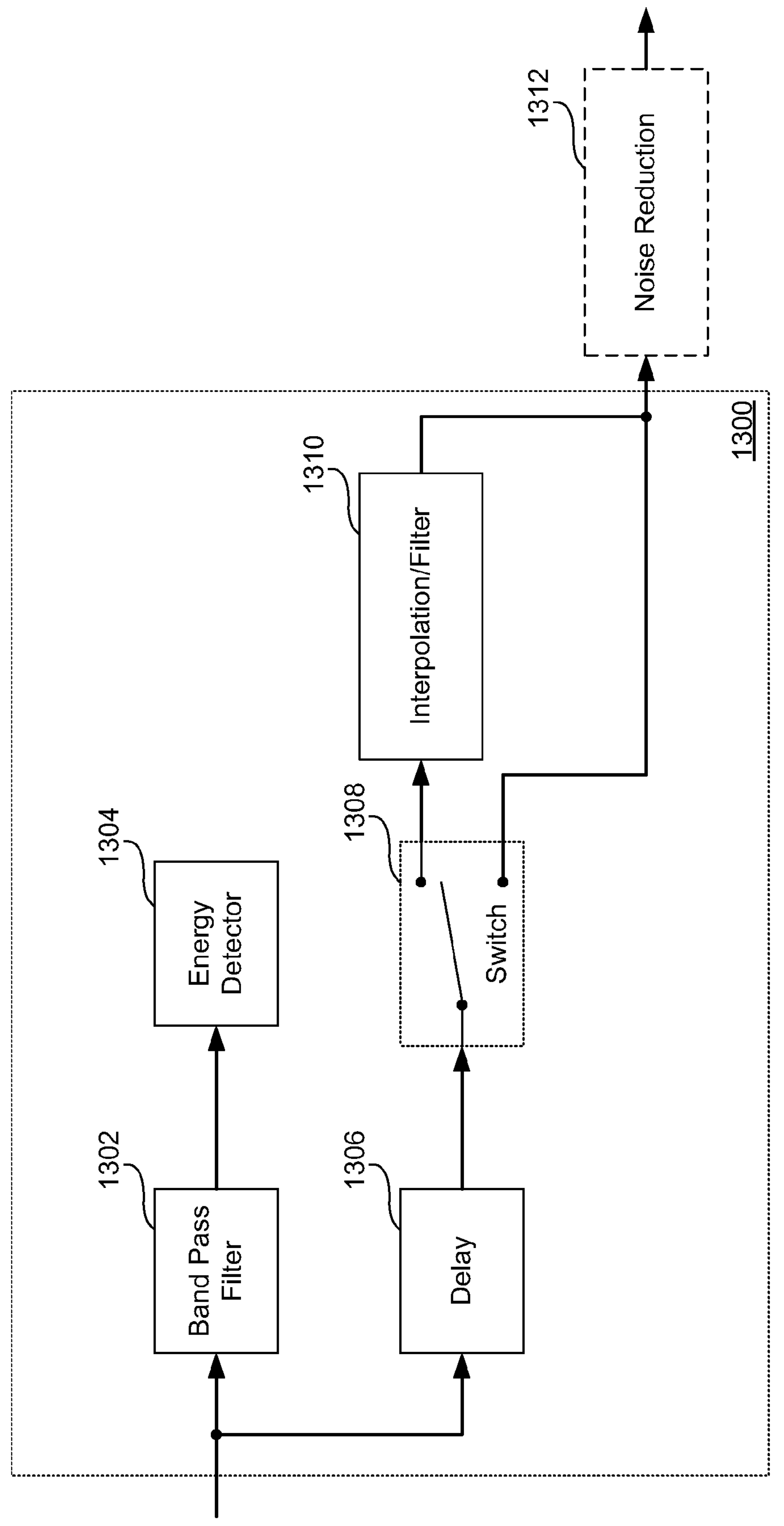
FIG. 13 is a block diagram illustrating a noise suppression system designed to eliminate spikey noise.

FIG. 13 is a block diagram illustrating a noise suppression system designed to eliminate the spikey noise. The system comprises band-pass filter 1302, energy detector 1304, delay 1306, switch 1308 and filter 1310. The audio signal, which can then be supplied by bridging application 936 from the first audio stack 910, is sent to band-pass filter 1302 where the pass band is selected. Since a spike resembles an impulse, it contributes energy to all frequencies; therefore, the ideal pass band for band-pass filter 1302 is any frequency range where no speech energy is expected, for example, frequencies greater than 10 kHz. Energy detector 1304 receives the filtered signal and determines whether sufficient energy exists in the pass band that is attributable to a spike. Based on the energy level detected, energy detector 1304 operates switch 1308. At the same time, the audio signal is also sent into delay 1306 and then to switch 1308. If the energy level detected by energy detector 1304 is indicative of a spike, the delayed audio signal is then sent to filter 1310 where any spike present can be removed. If the energy level detected by energy detector 1304 is not indicative of the spike, the delayed audio signal is not filtered and bypasses filter 1310. Filter 1310 can be any sort of filter used to remove spikes such as a low pass filter, a median filter, a smoothing filter or local interpolation. Because several samples are required for band-pass filter 1302 and energy detector 1304 to properly detect a spike, there is a delay between when the spike is encountered in the audio signal and when the spike is detected at energy detector 1304, so delay 1306 is used to compensate for the difference. However, the delay is very short, such as a sub-millisecond delay, and is typically beyond human perception. The output of the system can be introduced into second audio stack 904.

It should be noted that although noise reduction system 1300 is given in context of a captured audio stream by a bridging application, the noise reduction system can be used independently of system 900 whenever spikey noise of the characteristics described above are encountered. Furthermore, in addition to the filters given above, optionally, the audio signal can also be processed through second noise reduction system 1312 which can apply conventional noise suppression techniques such as smoothing filters, noise spectrum frequency suppression, noise cancellation, and other techniques know to those skilled in the art. While second noise reduction system 1312 could be applied before noise reduction system 1300, a noise reduction system could spread any spikes making it harder for noise reduction system 1300 to remove them. Typically, noise reduction system 1300 is used to remove spikey noise and noise reduction system 1312 is used to remove other types of noise such as environmental noise or electronic noise.

Although the noise reduction embodiments described above are depicted to be implemented as software within the bridging application, the bridging application could also simply direct the redirected audio stream to a hardware implementation of the noise reduction systems described, and the bridging application can then return the enhanced audio stream into the second audio stack after receiving it from the hardware noise reduction system. One of ordinary skill in the art would understand the relation between the bridging application and the noise reduction system to run the gamut from complete software implementation to varying degrees of hardware and software implementations.

From the above description of the invention it is manifest that various techniques can be used for implementing the concepts of the present invention without departing from its scope. Moreover, while the present invention has been described with specific reference to certain embodiments, a person of ordinary skill in the art would recognize that changes can be made in form and detail without departing from the spirit and the scope of the invention. It should also be understood that the invention is not limited to the particular embodiments described herein, but is capable of many rearrangements, modifications, and substitutions without departing from the scope of the invention.

What is claimed is:

1. A method for use in a computer for redirecting an audio stream from a first audio endpoint to a second audio endpoint in said computer having a controller and a computer operating system for execution by said controller, said method comprising:

directing said audio stream from a client application running on said computer operating system through a first audio resource stack of said computer to said first audio endpoint;

creating an audio endpoint bridge using an audio processing object driver within said first audio resource stack, wherein said audio endpoint bridge provides a path for said audio stream to be redirected from said audio processing object driver within said first audio resource stack to pass through a second audio resource stack to said second audio endpoint;

enhancing said audio stream to reduce noise, wherein said enhancing includes detecting energy from a spike in the audio stream, delaying the audio stream, and applying a spike removing procedure whenever energy from a spike is detected to generate an enhanced audio stream;

redirecting said enhanced audio stream to said second audio endpoint using said audio endpoint bridge.

2. The method of claim 1 wherein enhancing said audio stream comprises employing an algorithm selected from application of smoothing filters, noise spectrum frequencies suppression, linear predictive noise cancellation, or any combination thereof.

3. The method of claim 1, wherein enhancing said audio stream comprises:
estimating a noise level of the audio stream;
estimating a speech signal level of the audio stream;
determining a ratio of the speech signal level to the noise level (SNR);
attenuating the audio stream in a first frequency range using a first attenuation function based on the SNR; and
attenuating the audio stream in a second frequency range using a second attenuation function based on the SNR;
wherein the first frequency range is below the second frequency range, and wherein the first attenuation function has a lower maximum attenuation level than the second attenuation function.

4. The method of claim 3, wherein enhancing said audio stream further comprises:
detecting a silence area in the audio stream; and
stopping the estimating of the noise level of the audio stream during the silence area.

5. The method of claim 1 wherein the spike removing procedure comprises linear interpolation.

6. The method of claim 1, wherein said audio endpoint bridge is created by forming a bridging application so as to activate said second audio stack.

7. A computer capable of redirecting an audio stream from a first audio endpoint to a second audio endpoint in said computer, said computer comprising:
an operating system;
a controller configured to execute said operating system;
a first audio resource stack of said computer for directing said audio stream from a client application running on said operating system to said first audio endpoint, said first audio resource stack comprising an audio processing object driver;
a second audio resource stack of said computer connected to said second audio endpoint;
an audio endpoint bridge created by said audio processing object driver for redirecting said audio stream from said audio processing object driver through said second audio resource stack to said second audio endpoint, wherein said audio processing object driver is configured to form a bridging application running on said operating system so as to activate said second audio resource stack, thereby creating said audio endpoint bridge, and said bridging application is configured to:
enhance said audio stream to reduce noise by detecting energy from a spike in the audio stream, delaying the audio stream, and applying a spike removing procedure whenever energy from a spike is detected to generate an enhanced audio stream; and
redirect said enhanced audio stream to said second audio endpoint using said audio endpoint bridge.

8. The computer of claim 7 wherein the bridging application comprises a smoothing filter, a noise spectrum frequency suppressor, a linear predictive noise canceller, or a combination thereof.

9. The computer of claim 7, wherein the bridging application comprises:
a noise level estimator configured to estimate a noise level of the audio stream;
a speech signal level estimator configured to estimate a speech signal level of the audio stream, wherein the bridging application is configured to determine a ratio of the SNR;
a first attenuator configured to attenuate the audio stream in a first frequency range using a first attenuation function based on the SNR; and
a second attenuator configured to attenuate the audio stream in a second frequency range using a second attenuation function based on the SNR;
wherein the first frequency range is below the second frequency range, and wherein the first attenuation function has a lower maximum attenuation level than the second attenuation function.

10. The computer of claim 7, wherein the bridging application comprises:
a band-pass filter receiving the audio stream;
an energy detector coupled to the band-pass filter;
a delay module receiving the audio stream; and
a switch controlled by the energy detector and coupled to the delay module.

11. The computer of claim 10, wherein the spike remover comprises a linear interpolator.

* * * * *